United States Patent
Hsieh et al.

(10) Patent No.: US 12,181,743 B2
(45) Date of Patent: Dec. 31, 2024

(54) DISPLAY WITH PIEZO MATERIAL CHANGING POSITION OF LIGHT SOURCE RELATIVE APERTURE LAYER

(71) Applicant: Hewlett-Packard Development Company, L.P., Spring, TX (US)

(72) Inventors: Hsing-Hung Hsieh, Taipei (TW); Kuan-Ting Wu, Taipei (TW); Chi-Hao Chang, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 18/428,631

(22) Filed: Jan. 31, 2024

(65) Prior Publication Data
US 2024/0168332 A1 May 23, 2024

Related U.S. Application Data

(63) Continuation of application No. 17/634,666, filed as application No. PCT/US2019/055347 on Oct. 9, 2019, now Pat. No. 11,892,728.

(51) Int. Cl.
| G02F 1/137 | (2006.01) |
| G02F 1/1335 | (2006.01) |
| G02F 1/13357 | (2006.01) |
| G02F 1/1337 | (2006.01) |
| G02F 1/1343 | (2006.01) |
| G02F 1/1368 | (2006.01) |
| H10N 30/20 | (2023.01) |

(52) U.S. Cl.
CPC .. G02F 1/133606 (2013.01); G02F 1/133514 (2013.01); G02F 1/133528 (2013.01);
(Continued)

(58) Field of Classification Search
CPC ...... G02F 1/137; G02F 1/133606; G02F 1/33; G02F 1/335; G02F 1/1337; F21V 9/40;
(Continued)

(56) References Cited

U.S. PATENT DOCUMENTS

| 5,613,022 A * | 3/1997 | Odhner .................. G09F 9/375 359/32 |
| 7,697,185 B2 * | 4/2010 | Yoda .................... G02B 26/105 359/224.1 |

(Continued)

FOREIGN PATENT DOCUMENTS

| KR | 10-2018-0121293 A | 11/2018 |
| WO | 2016/197847 A2 | 12/2016 |

OTHER PUBLICATIONS

"Microsoft Invents Computer Display "Privacy Mode" Viewing", May 24, 2015 Patently Mobile , Microsoft wants to bring an Exciting Holographic Interface to Future Versions of their Surface Devices, retrieved at https://www.patentlymobile.com/2015/05/microsoft-invents-computer-display-privacy-mode-viewing.html, retrieved on Mar. 9, 2019 , 4 pages.

*Primary Examiner* — Ismael Negron
(74) *Attorney, Agent, or Firm* — Quarles & Brady LLP

(57) ABSTRACT

A display device includes an aperture layer, a first plurality of light sources, a second plurality of light sources, and a piezo material coupled to the first plurality of light sources and the second plurality of light sources. The aperture layer includes a first plurality of apertures and a second plurality of apertures, and the first plurality of light sources is arranged to correspond to the first plurality of apertures, and the second plurality of light sources is arranged to correspond to the second plurality of apertures. The piezo material is configured to alter a first position of the first plurality of light sources relative to the first plurality of apertures, and to alter a second position of the second plurality of light sources relative to the second plurality of apertures.

20 Claims, 5 Drawing Sheets

(52) U.S. Cl.
CPC ...... *G02F 1/1337* (2013.01); *G02F 1/134309* (2013.01); *G02F 1/1368* (2013.01); *G02F 1/137* (2013.01); *H10N 30/206* (2023.02)

(58) Field of Classification Search
CPC . F21V 9/45; F21V 14/02; F21V 14/08; H04R 17/00
See application file for complete search history.

(56) References Cited

U.S. PATENT DOCUMENTS

| | | | |
|---|---|---|---|
| 8,400,706 B2 * | 3/2013 | Iizuka | H10N 30/20 359/305 |
| 8,896,501 B2 | 11/2014 | Stahl et al. | |
| 8,976,093 B2 | 3/2015 | Daniel et al. | |
| 9,341,928 B2 * | 5/2016 | Kase | G03B 21/142 |
| 9,928,372 B2 | 3/2018 | Chang | |
| 10,025,938 B2 | 7/2018 | Krishnamurthi | |
| 10,542,235 B2 * | 1/2020 | Shin | H10K 59/871 |
| 10,959,023 B2 * | 3/2021 | Choi | G02F 1/133606 |
| 11,309,482 B2 * | 4/2022 | Masuda | H10N 30/40 |
| 11,512,836 B2 * | 11/2022 | Rossi | G02B 27/20 |
| 12,096,195 B2 * | 9/2024 | Okamoto | G02F 1/133606 |
| 2003/0128175 A1 | 7/2003 | Berstis | |
| 2016/0192047 A1 * | 6/2016 | Chang | G02B 6/0011 381/111 |
| 2016/0225337 A1 * | 8/2016 | Ek | G02B 27/288 |
| 2017/0068362 A1 | 3/2017 | Den Boer et al. | |
| 2020/0097244 A1 * | 3/2020 | Kim | H04R 1/24 |
| 2022/0299759 A1 | 9/2022 | Tatebe et al. | |
| 2022/0360733 A1 * | 11/2022 | Kim | H04R 17/005 |

\* cited by examiner

DISPLAY WITH PIEZO MATERIAL CHANGING POSITION OF LIGHT SOURCE RELATIVE APERTURE LAYER

RELATED APPLICATIONS

This application is a continuation of U.S. patent application Ser. No. 17/634,666 filed on Feb. 11, 2022, which represents the national stage of International Application No. PCT/US2019/055347 filed on Oct. 9, 2019, the entire contents of which are incorporated herein by reference.

BACKGROUND

A display or monitor can include an output device that can display information in a pictorial form. The display can include a plurality of light sources that can be utilized to generate images that are displayed utilizing different combinations of the plurality of light sources. The display can be coupled to a computing device to receive images from the computing device to generate the received images utilizing the plurality of light sources.

DETAILED DESCRIPTION

Figure 1:
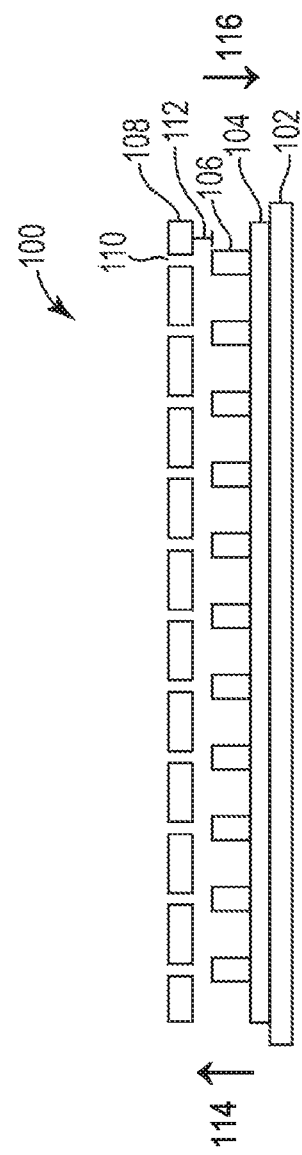
FIG. 1 is an example device for providing light source distance alterations consistent with the present disclosure.

Displays can be devices to display digital images. In some examples, a display can be a computing device display, a laptop display, a phone display, and/or a television display. Displays can be utilized to perform a plurality of different functions. For example, displays can be coupled to computing devices to allow a user to make selections and interact with the computing device. In some examples, the selections or interactions through a display can include sensitive information that a user may want to restrict from other individuals within an area. In these examples, a privacy display can be utilized to prevent individuals around the display from viewing the images displayed on the display.

In some examples, a privacy display can utilize filters that can scatter the light generated by the plurality of light sources near the edges of the display to generate what appears to be a white background to a user positioned at a particular angle from the display (e.g., an angle that is greater than a threshold angle, etc.). These examples of a privacy display can be considered white background privacy displays. The white background privacy displays can utilize a relatively higher quantity of electrical energy to generate the white background portion of the privacy display.

In some examples, a privacy display can utilize a collimated backlight that utilizes light sources that are angled toward a center of the display. In this way, a brightness level of the plurality of light sources can be altered such that a user positioned across from a center of the display can view the images displayed and a user positioned near the edges of the display views a dark or black background instead of the images displayed. In this way, a user of the display can prevent other individuals from viewing what the user considers private information. These privacy displays can be considered black background privacy displays. The black background privacy displays can be limited to relatively bright display settings, which can be difficult to utilize in low light environments.

The present disclosure relates to systems and devices for providing light source distance alterations that can be utilized to generate sharing mode portions and privacy mode portions that are simultaneously displayed on the display. For example, the present disclosure can utilize piezo material devices or a piezo material layer that can be utilized to alter a position of a particular light source. In this example, the piezo material device can raise or lower a single light source or plurality of light sources to alter a distance between the single light source or plurality of light sources and an aperture plate or aperture layer. In this way, a quantity of light provided to other layers of the display can be based on the distance between the light source and the aperture plate. Thus, systems and devices described herein can provide black background privacy mode portions and sharing mode portions displayed simultaneously on the display. In this way, sensitive information or portions of the display can be identified to be privacy mode portions of the display and non-sensitive information or other portions of the display can be identified as sharing mode portions of the display.

In some examples, a particular light source can be positioned closer or further away from a particular aperture of an aperture layer, which can alter the quantity or angle of light provided to a surface of the display from the particular light source. Thus, the present disclosure can be utilized to alter a quantity of light provided or an angle of light provided by each light source or pixel of a display. In this way, the present disclosure can be utilized to selectively make each light source or pixel have a selected quantity of light or angle of light provided by the light source or pixel.

By selectively altering the light provided or angle of light provided by each light source or pixel can allow devices or systems to simultaneously generate privacy mode portions and sharing mode portions for the display on light source by light source basis. These features can be utilized to generate privacy mode portions of the display that are directed to selected private portions or selected private information (e.g., sensitive information, information not to be shared with particular individuals, etc.) while also being utilized to generate sharing mode portions of the display that can be directed to selected public portions or selected public information (e.g., non-sensitive information, information to be shared with a particular individual, etc.).

FIG. 1 is an example device 100 for providing light source 106 distance alterations consistent with the present disclosure. In some examples, the device 100 can be a portion of a display device. For example, the device 100 can be part of a device for displaying digital images to a user. In some examples, the device 100 can be utilized to generate images utilizing a plurality of light sources 106. As used herein, the plurality of light sources 106 can include devices that are capable of generating light. For example, the plurality of light sources 106 can include, but are not limited to: a light emitting diode (LED), an organic light emitting diode (OLED), display light sources, and/or other types of backlight sources.

In some examples, the device 100 can include a substrate 102. As used herein, a substrate 102 can include a material that can be utilized to couple another material. For example, the substrate 102 can comprise a material (e.g., silicon, printed circuit board (PCB), printed circuit assembly (PCA), etc.) that can be utilized to couple other materials such as, but not limited to, a piezo material layer 104, a piezo material device, electrodes, and/or light sources 106. In a specific example, the substrate 102 can be a PCB that can include electrodes that can be electrically or communicatively coupled to the piezo material layer 104 and the plurality of light sources 106. As used herein, a piezo material layer 104 can include a layer of piezo material devices. As used herein, a piezo material device can include a device that utilizes a piezo material to alter a position of a device (e.g., light source 106, etc.).

As used herein, a piezo material can include a material that can accumulate an electric charge to provide a piezoelectric effect. For example, the piezo material can include, but is not limited to: a crystal material, a ceramic material, gallium phosphatelithium niobate, lithium tantalite, barium titanate, bismuth ferrite, bismuth titanate, gallium arsenide, zinc oxide, aluminium nitride, lead zirconate-titanate (PZT), lead lanthanum zirconate titanate (PLZT), sodium bismuth titanate, or other types of materials that can accumulate an electric charge to provide a piezoelectric effect. In some examples, the piezoelectric effect of the material can result in the piezoelectric material changing in size or shape. In this way, the piezo material layer 104 can alter the distance 112 between the light source 106 and a corresponding aperture 110 of the aperture layer 108. For example, the piezo material layer 104 can include a material that expands and contracts to different sizes based on a voltage applied to the piezo material layer 104 through an electrical connection. In this example, a first voltage can be applied to the piezo material layer 104 to increase a size of the piezo material layer 104 or portion of the piezo material layer 104 and a second voltage can be applied to the piezo material layer 104 to decrease the size of the piezo material layer 104 or a portion of the piezo material layer 104. In this way, a light source 106 can be raised in the direction of arrow 114 or lowered in the direction of arrow 116 based on a voltage applied to the piezo material device from the piezo material layer 104 that is coupled to the light source 106.

As used herein, the aperture layer 108 can include an opaque material with a plurality of apertures 110 that each correspond to one of the plurality of light sources 106. As used herein, an opaque material can include a material that completely or substantially prevents light from passing through the material. That is, the aperture layer 108 can provide other layers with light emitted from the light sources 106 through the apertures 110, but may not allow light emitted from the light sources 106 through non-aperture areas (e.g., areas surrounding the apertures or holes of the aperture layer 108. As used herein, the apertures 110 can include holes or portions of the opaque material that is removed to allow light to pass through the aperture layer 108. In some examples, each of a plurality of apertures 110 can correspond to each of a plurality of light sources 106. In this way, light emitted from a particular light source 106 may pass through a corresponding aperture 110 of the aperture layer 108 and not through other apertures of the aperture layer 108.

In some examples, the device 100 can be utilized to alter a distance 112 between a light source 106 and an aperture 110 of the aperture layer 108 to alter a quantity or angle of light provided by the light source 106. For example, the light source 106 can be coupled to a piezo material device of the piezo material layer 104. In this example, a voltage can be applied to the piezo material device that is coupled to the light source 106 to alter the distance 112 between the light source 106 and an aperture 110 of the aperture layer 108. In this example, a first voltage can be applied to the piezo material device coupled to the light source 106 to provide a first value for the distance 112 (e.g., a first distance, etc.) and a second voltage can be applied to the piezo material device to provide a second value for the distance 112 (e.g., a second distance, etc.). In this way, the light source 106 can be positioned closer or further away from a corresponding aperture 110 of the aperture layer 108.

In some examples, a first voltage can be applied to a first piezo material device to move a first light source 106 in the direction of arrow 114. In this way, the first light source 106 can be positioned closer to the aperture 110 of the aperture layer 108 and a greater quantity of light or a greater angle of light can be provided through the aperture 110. In these examples, a second voltage can be applied to a second piezo material device to move a second light source 106 in the direction of arrow 116. In this way, the second light source 106 can be positioned further away from the aperture 110 of the aperture layer 108 and a lower quantity of light or lower angle of light can be provided through the aperture 110. In these examples, the first voltage can be utilized to position light sources 106 for a sharing mode and the second voltage can be utilized to position the light sources 106 for a privacy mode. That is, lights sources 106 can display images in a sharing mode when the light sources 106 are positioned closer to the apertures 110 or aperture layer 108 and light sources 106 can display images in a privacy mode when the light sources 106 are positioned further away from the apertures 110 or aperture layer 108.

In some examples, the device distance 112 generated by the piezo material devices coupled to the light sources 106 can be based on a mode of the device 100 and/or a mode of the light sources 106. For example, the device 100 can be determine or receive a determination that a first portion of the light sources 106 are to be put into a privacy mode and a second portion of the light sources 106 are to be put into a sharing mode. In this example, the first portion of the light sources 106 can be utilized to generate sensitive information or images and the second portion of the light sources 106 can be utilized to generate non-sensitive information or images. In this way, the device 100 can alter each of the plurality of light sources 106 to a sharing mode or privacy mode, which can be utilized to generate privacy zones and sharing zones throughout a display in order to use privacy modes for specific areas of the display.

Figure 2:
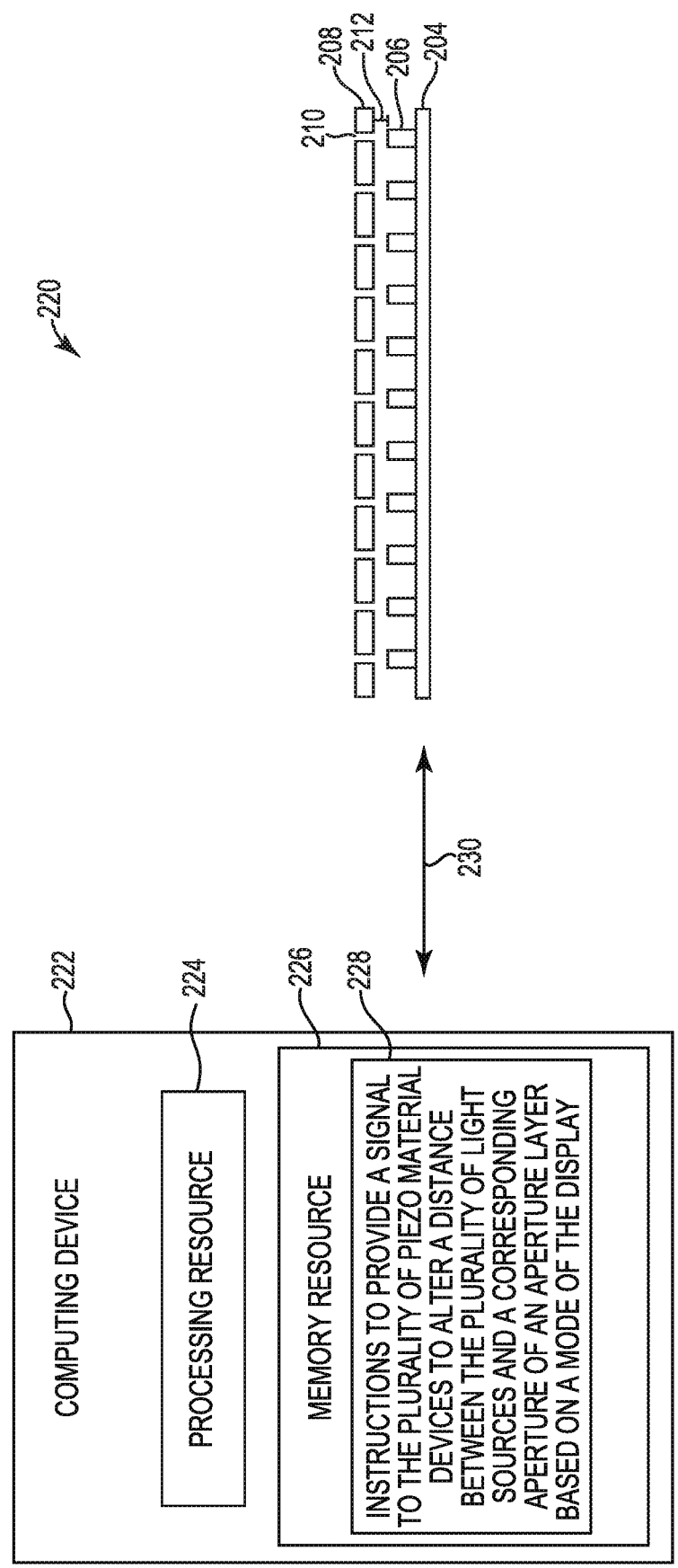
FIG. 2 is an example system for providing light source distance alterations consistent with the present disclosure.

FIG. 2 is an example system 220 for providing light source 206 distance alterations consistent with the present disclosure. In some examples, the system 220 can include similar elements as device 100 as referenced in FIG. 1. For example, the system 220 can include a portion of a display that includes a piezo material layer 204, a plurality of light sources 206, and/or an aperture layer 208 that includes a plurality of apertures 210. As described herein, the piezo material layer 204 can include a plurality of piezo material devices that can be utilized to alter a distance 212 between the light sources 206 and corresponding apertures 210 of the aperture layer 208.

As described herein, the piezo material layer 204 can include a plurality of piezo material devices. In some examples, the piezo material devices can include a piezo material and an electrode coupled to the piezo material. In some examples, the piezo material layer 204 can cover an entire surface of a substrate and the piezo material devices can be defined by positioning the electrodes at specific locations (e.g., at locations of light sources 206, etc.). For example, the piezo material devices can be areas surrounding the electrodes when the piezo material is covering the surface of the substrate. In other examples, the piezo material devices can be separated by a non-piezo material. For example, a piezo material can be coupled to a substrate, an electrode, and/or a light source 206. In this example, the piezo material of the piezo material device can be surrounded by a non-piezo material to separate the piezo material device from other piezo material devices.

In some examples, the piezo material layer 204 can be electrically and/or communicatively coupled to a computing device 222. For example, the computing device 222 can be coupled to the piezo material layer 204 through connection path 230. In some examples, the computing device 222 can be utilized to generate a voltage to be applied through the plurality of electrodes to provide a particular voltage to each of the plurality of piezo material devices. In some examples, the computing device 222 can instruct a different device to apply the different voltages to the different piezo material devices based on a mode of the corresponding light sources 206 as described herein.

In some examples, the computing device 222 can include a processing resource 224 and/or a memory resource 226 storing instructions 228 to perform particular functions. A processing resource 224, as used herein, can include a number of processing resources capable of executing instructions stored by a memory resource 226. The instructions (e.g., machine-readable instructions (MRI), computer-readable instructions (CRI), etc.) can include instructions stored on the memory resource 226 and executable by the processing resource 224 to perform or implement a particular function. The memory resource 226, as used herein, can include a number of memory components capable of storing non-transitory instructions that can be executed by the processing resource 224.

The memory resource 226 can be in communication with the processing resource 224 via a communication link (e.g., communication path). The communication link can be local or remote to an electronic device associated with the processing resource 224. The memory resource 224 includes instructions 228. The memory resource 226 can include more or fewer instructions than illustrated to perform the various functions described herein. In some examples, instructions (e.g., software, firmware, etc.) can be downloaded and stored in memory resource 226 (e.g., MRM) as well as a hard-wired program (e.g., logic), among other possibilities. In other examples, the computing device 222 can be hardware, such as an application-specific integrated circuit (ASIC), that can include instructions to perform particular functions.

The computing device 222 can include instructions 228, that when executed by a processing resource 224 can provide a signal to the plurality of piezo material devices to alter a distance 212 between the plurality of light sources 206 and a corresponding aperture 210 of an aperture layer 208 based on a mode of the display. As described herein, a mode of a display can include a brightness mode, a sharing mode, and/or a privacy mode. For example, the display can include a first mode (e.g., sharing mode, etc.) that allows individuals at an angle to the display to view the images displayed on the display. In this example, the display can include a second mode (e.g., privacy mode, etc.) that prevents individuals at an angle to the display from viewing the images displayed on the display. In this way, the display can restrict what is being displayed to users that are directly in front of the display and/or using the display. This can allow a user to utilize a display to generate sensitive images without the risk of other individuals viewing the sensitive images or sensitive data. In some examples, the signal (e.g., voltage, etc.) can alter a size or shape of the piezo material device which alters the distance 212 of a corresponding light source 206 of the plurality of light sources 206 and a corresponding aperture 210 of the aperture layer 208.

In some examples, the display can be put into a tracking mode. As used herein, a tracking mode can include instructions that are executable by a processing resource (e.g., processing resource 224, etc.) to track or identify sensitive information displayed on a display. In this mode, the identified sensitive information can correspond to a portion of the plurality of light sources 206 and the corresponding piezo material devices can be altered to put the portion of the plurality of light sources 206 into a privacy mode while the remaining or different portion of the plurality of light sources remain in a sharing mode. In this way, the sensitive information can be protected with a privacy mode and the remaining information can be viewable in a sharing mode.

In some examples, the display mode can be entirely in a privacy mode (e.g., entire screen or display is in privacy mode, etc.) or entirely in a sharing mode (e.g., entire screen or display is in a sharing mode, etc.). For example, the computing device 222 can apply the same voltage to the plurality of piezo material devices to align the plurality of light sources 206 to a particular distance 212 to put the display in a mode for the display. In other examples, the display can be split into sections and a particular voltage can be applied to the piezo material devices within each of the sections to apply a corresponding mode to each of the sections. In this way, a user can create a privacy section and a sharing section. The user can then determine the sensitivity of the information and the likelihood of surrounding users obtaining the information and position the information accordingly within a privacy section or a sharing section of the display.

Figure 3:
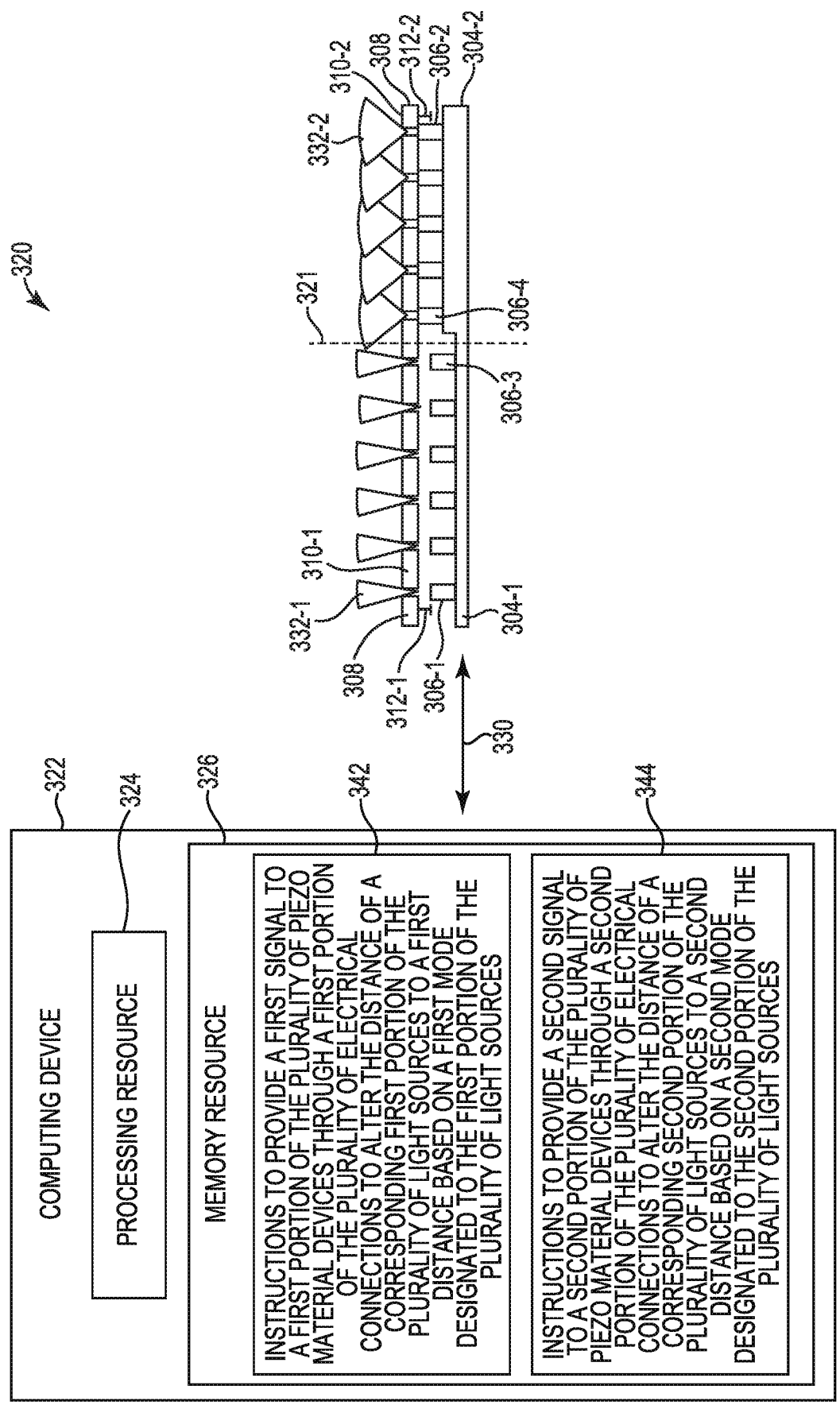
FIG. 3 is an example system for providing light source distance alterations consistent with the present disclosure.

FIG. 3 is an example system 320 for providing light source 306 distance alterations consistent with the present disclosure. In some examples, the system 320 can include similar elements as system 220 as referenced in FIG. 2, and/or device 100 as referenced in FIG. 1. For example, the system 320 can include a portion of a display that includes a piezo material layer 304-1, 304-2, a plurality of light sources 306-1, 306-2, and/or an aperture layer 308 that includes a plurality of apertures 310-1, 310-2. As described herein, the piezo material layer 304-1, 304-2 can include a plurality of piezo material devices that can be utilized to alter a distance 312-1, 312-2 between the light sources 306-1, 306-2 and corresponding apertures 310-1, 310-2 of the aperture layer 308.

In some examples, the computing device 322 can be the same or similar device as computing device 222 as referenced in FIG. 2. For example, the computing device 322 can include a processing resource 324 and/or a memory resource 326 storing instructions 342, 344 to perform particular functions. In some examples, the computing device 322 can include instructions 342, that when executed by a processing resource 324 can provide a first signal to a first portion of the plurality of piezo material devices (e.g., piezo material layer 304-1, piezo material devices within piezo material layer 304-1, etc.) through a first portion of the plurality of electrical connections (e.g., electrodes, etc.) to alter the distance 312-1 of a corresponding first portion of the plurality of light sources 306-1 to a first distance based on a first mode designated to the first portion of the plurality of light sources 306-1. As described herein, a quantity of light projected from the display by a particular light source 306-1, 306-2 of the plurality of light sources 306-1, 306-2 is based on a distance 312-1, 312-2 between the particular light source 306-1, 306-2 and a corresponding aperture 310-1, 310-2 of the aperture layer 308. That is, the plurality of piezo material devices can be independently adjusted to independently adjust the distance 312-1, 312-2 of the plurality of light sources 306-1, 306-2.

In some examples, the first mode can be a privacy mode. In these examples, the computing device 322 can provide a first voltage to the piezo material devices and/or electrodes of the piezo material layer 304-1 to put the corresponding light sources 306-1 into a privacy mode. As described herein, putting the light sources 306-1 into a privacy mode can include increasing the distance 312-1 to position the light sources 306-1 further away from the apertures 310-1 and/or aperture layer 308. In this way, the light 322-1 that passes through the apertures 310-1 can have a relatively lower angle and/or a relatively lower quantity of light. In this way, the light 332-1 can be more difficult to see at an angle to the display surface. For example, the portion of the display generated by the light 332-1 may appear dark or black to a user that is not positioned directly in front of the display. In this way, the portion of the light sources 306-1 can generate a privacy portion of the display.

In some examples, the computing device 322 can include instructions 344, that when executed by a processing resource 324 can provide a second signal to a second portion of the plurality of piezo material devices (e.g., piezo material layer 304-2, piezo material devices positioned within piezo material layer 304-2, etc.) through a second portion of the plurality of electrical connections (e.g., electrodes, etc.) to alter the distance 312-2 of a corresponding second portion of the plurality of light sources 306-2 to a second distance based on a second mode designated to the second portion of the plurality of light sources 306-2. In some examples, the first portion of elements (e.g., first portion of light sources 306-1, first portion of apertures 310-1, etc.) can be separated by line 321, which can separate light source 306-3 and light source 306-4. In this way, the system 320 can separate the portions and/or modes of the light sources 306-1, 306-2, 306-3, 306-4 on a light source basis or pixel basis.

In some examples, the second mode can be a sharing mode. In these examples, the computing device 322 can provide a second voltage to the piezo material devices and/or electrodes of the piezo material layer 304-2 to put the corresponding light sources 306-2 into a sharing mode. As described herein, putting the light sources 306-2 into a sharing mode can include decreasing the distance 312-2 to position the light sources 306-2 closer to the apertures 310-2 and/or aperture layer 308. In this way, the light 322-2 that passes through the apertures 310-2 can have a relatively larger angle and/or a relatively larger quantity of light. In this way, the light 332-2 can be more visible to a user at an angle to the display surface. For example, the portion of the display generated by the light 332-2 may appear as bright and clear to a user that is not positioned directly in front of the display as a user directly in front of the display. In this way, the portion of the light sources 306-2 can generate a sharing portion of the display.

Figure 4:
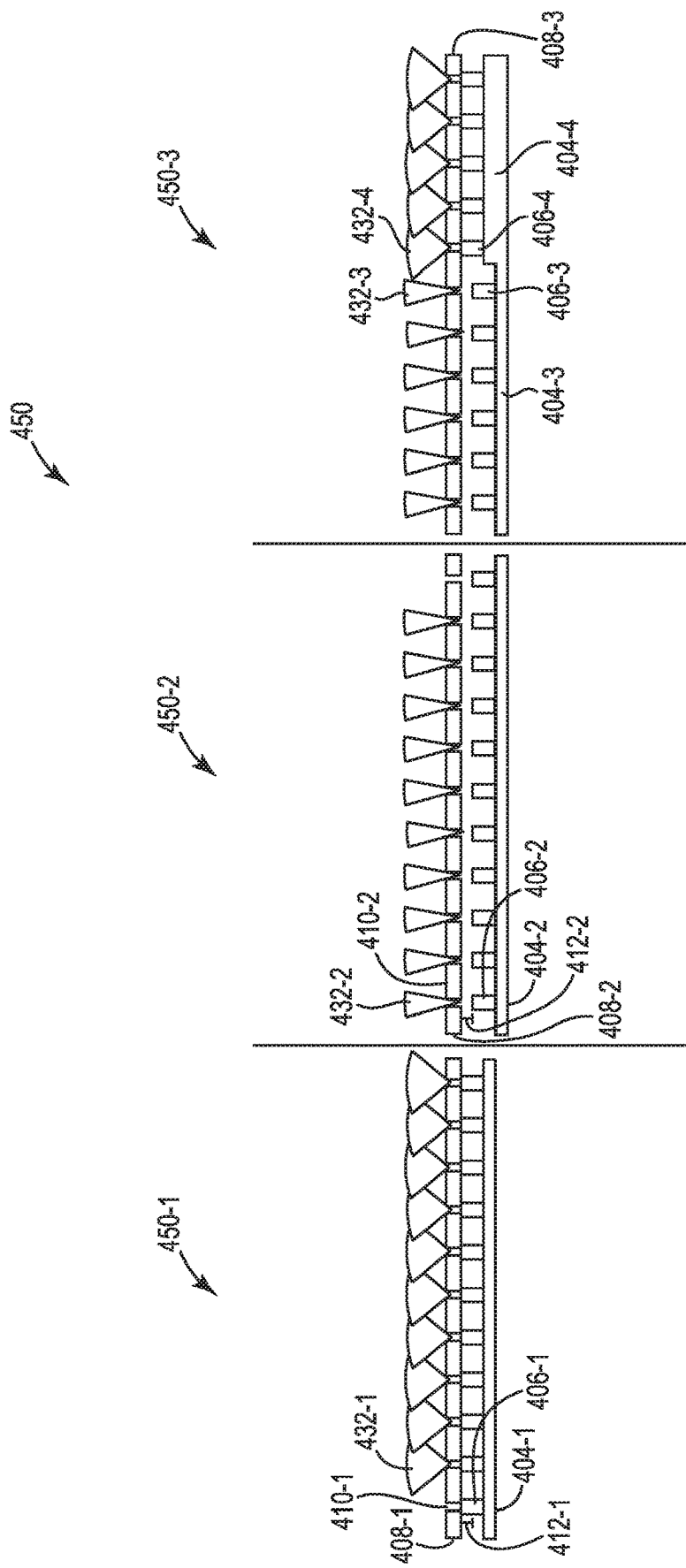
FIG. 4 is an example of a plurality of modes for providing light source distance alterations consistent with the present disclosure.

FIG. 4 is an example of a plurality of modes 450 for providing light source 406-1, 406-2, 406-3, 406-4 distance alterations consistent with the present disclosure. In some examples, FIG. 4 can illustrate devices that are positioned within different modes 450. In some examples, the devices can be the same or similar device as device 100 as referenced in FIG. 1. For example, the devices can include a piezo material layer 404-1, 404-2, 404-3, 404-4, a plurality of light sources 406-1, 406-2, 406-3, 406-4, and/or an aperture layer 408-1, 408-2, 408-3. In some examples, the plurality of modes 450 can include a sharing mode 450-1, a privacy mode 450-2, and/or a split sharing/privacy mode 450-3.

In some examples, the sharing mode 450-1 can include a mode where a relatively greater quantity of light 432-1 and/or a relatively greater angle of light 432-1 is provided through an aperture 410-1. As described herein, the sharing mode 450-1 can be a mode that allows the images displayed on the display to be viewable from an angled position of the display. In this way, a user that is positioned to the right or left of a user of the display can be able to view what is being displayed on the display. In some examples, the piezo material layer 404-1 can be provided with a first voltage to adjust the distance 412-1 between the light sources 406-1 and the apertures 410-1 to a relatively low distance to allow more of the light 432-1 to pass through the aperture 410-1. In this way, the light source 406-1 is relatively close to the aperture 410-1 and less light is blocked by the opaque portion of the aperture layer 408-1.

In some examples, the privacy mode 450-2 can include a mode where a relatively lower quantity of light 432-2 and/or a relatively lower angle of light 432-2 is provided through an aperture 410-2. For example, the quantity and/or angle of the light 432-2 can be lower than the light 432-1. As described herein, the privacy mode 450-2 can be a mode that prevents the images displayed on the display from being viewable from an angled position of the display (e.g., portions or area appears black or dark, etc.). In this way, a user that is positioned to the right or left of a user of the display can be prevented from viewing what is being displayed on the display. In some examples, the piezo material layer 404-2 can be provided with a second voltage to adjust the distance 412-2 between the light sources 406-2 and the apertures 410-2 to a relatively high distance to allow less of the light 432-2 to pass through the aperture 410-2. In this way, the light source 406-2 is relatively far from the aperture 410-2 and more light is blocked by the opaque portion of the aperture layer 408-2.

In some examples, the split sharing/privacy mode 450-3 can include a first piezo material layer portion 404-3 that is provided with a first voltage that is similar to the voltage applied to the piezo material layer 404-1 and a second piezo material layer portion 404-4 that is provided with a second voltage that is similar to the voltage applied to the piezo material layer 404-2. In this way, a first light source 406-3 is in a privacy mode and a second light source 406-4 is in a sharing mode. For example, the first light source 406-3 can be positioned a first distance from the aperture layer 408-3 and the second light source 406-4 can be positioned at a second distance from the aperture layer 408-3. In this example, the first distance can be greater than the second distance such that the light 432-3 provided by the first light source 406-3 is less or with a lower angle than the light 432-4 provided by the second light source 406-4. In this way, the first light source 406-3 can provide a privacy mode while an adjacent second light source 406-4 can provide a sharing mode. In this way, each pixel or light source within a display can be altered to a particular mode based on a voltage applied to a corresponding piezo material of the light source.

Figure 5:
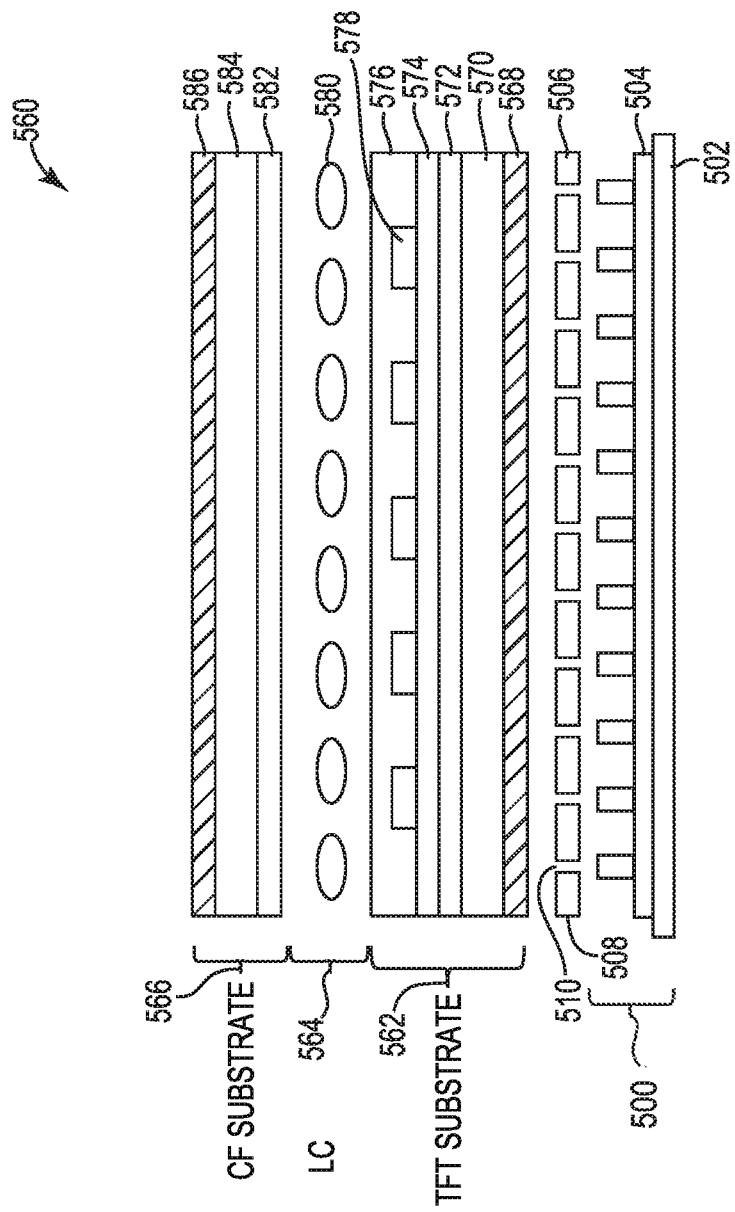
FIG. 5 is an example of a display with a plurality of layers for providing light source distance alterations consistent with the present disclosure.

FIG. 5 is an example of a display 560 with a plurality of layers 500, 562, 564, 566 for providing light source distance alterations consistent with the present disclosure. FIG. 5 illustrates a cross section view of the display 560 to illustrate different layers of the display 560 that can be utilized with the devices (e.g., device 100, etc.) as described herein. In some examples, the display 560 can include a light source layer 500. In some examples, the light source layer 500 can include the same or similar element as device 100 as referenced in FIG. 1. For example, the light source layer 500 can include a substrate 502, light sources 506, and/or an aperture layer 508 that includes a plurality of apertures 510.

In some examples, the display 560 can include a thin-film transistor (TFT) substrate layer 562, a liquid crystal (LC) layer 564, and/or a color filter (CF) substrate layer 566. In some examples, the CF substrate layer 566 can include a polarizer 586, a glass substrate 584, and/or an alignment substrate 582. In some examples, the CF substrate layer 566 can have a common electrode removed. That is, the CF substrate layer 566 may not include a common electrode to control a pre-tilt angle of a liquid crystal from the LC layer 564 adjacent to the CF substrate layer 566. In some examples, the LC layer 564 can include a plurality of liquid crystals 580 that can be aligned to form objects or images on the display 560.

In some examples, the TFT substrate 562 can include an alignment substrate 576 with a plurality of pixel electrodes 578. The TFT substrate 562 can also include an insulator 574, a common electrode 572, a glass substrate 570, and/or a polarizer 568. A plurality of layers are described that form the TFT substrate 562, however, additional layers can be added or fewer layers can be utilized to form the TFT substrate 562. In some examples, the light source layer 500 can provide light from a plurality of light sources 506 such as LEDs, such that the light is projected through the apertures 510 to the TFT substrate 562, through the LC layer 564, and through the CF substrate layer 566. In some examples, a computing device or system can be coupled to the display 560 to project digital images from the computing device or system onto the display 560. As described herein, the light source layer 500 can utilize the piezo material layer 504 to adjust a distance between the light sources 506 and the apertures 510 of the aperture layer 508 to alter between a plurality of modes or to alter a quantity of light or angle of light provided to the other layers of the display 560.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure and should not be taken in a limiting sense. Further, as used herein, "a number of" an element and/or feature can refer to any number of such elements and/or features.

What is claimed:

1. A display device comprising:
    an aperture layer including a first plurality of apertures and a second plurality of apertures;
    a first plurality of light sources arranged to correspond to the first plurality of apertures;
    a second plurality of light sources arranged to correspond to the second plurality of apertures; and
    a piezo material coupled to the first plurality of light sources and the second plurality of light sources, the piezo material configured to alter a first position of the first plurality of light sources relative to the first plurality of apertures, and to alter a second position of the second plurality of light sources relative to the second plurality of apertures.

2. The display device of claim 1, wherein the display is configured to independently alter the first position and the second position of the first plurality of light source and the second plurality of light sources, respectively.

3. The display device of claim 1, further comprising a computing device to generate a voltage to be applied to the piezo material to cause the piezo material to alter the first position and the second position.

4. The display device of claim 3, wherein the piezo material comprises a first plurality of piezo material devices each corresponding to one of the first plurality of light sources and a second plurality of piezo material devices each correspond to one of the second plurality of light sources.

5. The display device of claim 4, wherein the first plurality of piezo material devices and the second plurality of piezo material devices are configured to be independently adjusted to independently alter the first positions of the first plurality of light source and the second positions of the second plurality of light sources.

6. The display device of claim 1, wherein the piezo material alternates the first position between a first distance and a second distance different from the first distance, and alternates the second position between a third distance and a fourth distance different from the third distance.

7. The display device of claim 6, wherein the first distance and the third distance are equal; and wherein the second distance and the fourth distance are equal.

8. The display device of claim 6, wherein the first distance allows a first quantity of light from the first plurality of light sources to pass through the aperture layer and the second distance allows a second quantity of light from the first plurality of light sources to pass through the aperture layer, wherein the first quantity of light is greater than the second quantity of light.

9. The display device of claim 6, wherein the piezo material alternates the first plurality of light sources to the first distance when a first portion of the display is in a sharing mode and the piezo material alternates the first plurality of light sources to the second distance when the first portion of the display is in a privacy mode, wherein the sharing mode is to provide a first viewing angle and the privacy mode is to provide a second viewing angle, the first viewing angle larger than the second viewing angle.

10. The display device of claim 9, wherein the piezo material alternates the second plurality of light sources to the third distance when a second portion of the display is in the sharing mode and the piezo material alternates the second plurality of light sources to the fourth distance when the second portion of the display is in the privacy mode.

11. A method comprising:
    providing a first signal to a piezo material to alter a distance between a first light source of a display and a corresponding first aperture of an aperture layer of the display to a first position based on a first mode of the display; and
    providing a second signal to the piezo material to alter the distance between the first light source of the display and the corresponding first aperture of the aperture layer of the display to a second position based on a second mode of the display, wherein the first position is different from the second position.

12. The method of claim 11, wherein, at the same time as providing the first signal, providing a third signal to the piezo material to alter a distance between a second light source of the display and a corresponding second aperture of the aperture layer of the display to the second position based on the second mode of the display.

13. The method of claim 11, wherein, at the same time as providing the first signal, providing a third signal to the piezo material to alter a distance between a second light source of the display and a corresponding second aperture of the aperture layer of the display to the first position based on the first mode of the display.

14. The method of claim 11, wherein the first position allows a greater angle of light distribution through the corresponding first aperture associated with the first light source than the second position.

15. The method of claim 11, wherein providing the first signal comprises altering a size or shape of the piezo material.

16. The method of claim 11, further comprising tracking information displayed on the display at the first light source, and determining whether to provide the first signal or the second signal based on a sensitivity of the information displayed on the display at the first light source.

17. The method of claim 16, wherein providing the first signal to the piezo material to alter the distance between the first light source and the corresponding first aperture of the aperture layer includes providing the first signal to the piezo material to alter a plurality of distances between a plurality of light sources and corresponding apertures of the aperture layer to the first position to place an entirety of the display in the first mode.

18. A non-transitory machine-readable medium comprising a processing resource in communication with a display device, the processing resource having instructions executable to:

provide a first signal to a first piezo material device of a piezo material layer to alter a distance between a first light source of the display device and a corresponding first aperture of an aperture layer of the display device to a first position based on a first mode designated to the first light source; and provide a second signal to the first piezo material device to alter the distance between the first light source of the display device and the corresponding first aperture of the aperture layer of the display device to a second position based on a second mode designated to the first light source, wherein the first position is different from the second position.

19. The medium of claim 18, further comprising to:

provide a third signal to a second piezo material device of the piezo material layer to alter a distance between a second light source of the display device and a corresponding second aperture of the aperture layer of the display device to the first position based on the first mode designated to the second light source; and provide a fourth signal to the second piezo material device to alter the distance between the second light source of the display device and the corresponding second aperture of the aperture layer of the display device to the second position based on the second mode designated to the second light source.

20. The medium of claim 18, wherein the first signal comprises a first voltage that alters a size of the first piezo material device to a first size and the second signal comprises a second voltage that alters the size of the first piezo material device to a second size, the first size being different from the second size.

* * * * *